United States Patent [19]
Yuen et al.

[11] Patent Number: 6,069,908
[45] Date of Patent: May 30, 2000

[54] N-DRIVE OR P-DRIVE VCSEL ARRAY

[75] Inventors: Albert T. Yuen, Los Altos; Michael R. T. Tan, Menlo Park; Chun Lei, Sunnyvale, all of Calif.

[73] Assignee: Hewlwtt-Packard Company, Palo Alto, Calif.

[21] Appl. No.: 09/020,724

[22] Filed: Feb. 9, 1998

[51] Int. Cl.$^7$ .................................................... H01S 3/19
[52] U.S. Cl. ................... 372/96; 372/46; 372/50
[58] Field of Search ............................ 372/45–50, 96–99

[56] References Cited

U.S. PATENT DOCUMENTS

| | | | |
|---|---|---|---|
| 5,274,655 | 12/1993 | Shieh et al. | 372/45 |
| 5,331,658 | 7/1994 | Shieh et al. | 372/50 |
| 5,475,701 | 12/1995 | Hibbs-Brenner | 372/50 |
| 5,831,960 | 11/1998 | Jiang et al. | 372/45 |

*Primary Examiner*—Hemang Sanghavi

[57] ABSTRACT

A VCSEL that is adapted to the fabrication of an array of VCSELs. A VCSEL array according to the present invention includes first and second VCSELs for generating light of a predetermined wavelength. Each VCSEL includes a bottom reflector comprising an epitaxial layer of a semiconductor of a first conductivity type, a light generation region and a top reflector comprising a semiconductor of a second conductivity type. A bottom electrode is electrically connected to the bottom reflector, and a top electrode is electrically connected to the top reflector. The bottom electrode is grown on top of a buffer layer having an electrical conductivity less than a predetermined value and a crystalline structure that permits epitaxial growth of the bottom reflector on the buffer layer. The buffer layer may be grown on top of a substrate or be the substrate itself in the case in which a substrate having sufficiently low conductivity is utilized. The bottom reflector of each of the VCSELs is in contact with the top of the buffer layer. The first and second VCSELs are electrically isolated from one another by a trench extending into the buffer layer. The buffer layer is constructed from a material having resistivity that is sufficiently low to prevent cross-talk between the first and second VCSELs.

6 Claims, 3 Drawing Sheets

N-DRIVE OR P-DRIVE VCSEL ARRAY

This invention was made with United States Government support under Agreement No. MDA972-94-3-0017. The United States Government has certain rights in the invention.

FIELD OF THE INVENTION

The present invention relates to lasers, and more particularly, to an improved Vertical Cavity Surface-Emitting Laser.

BACKGROUND OF THE INVENTION

Vertical Cavity Surface-Emitting Lasers (VCSELs) are currently being considered for use in many high speed communication systems. A VCSEL may be viewed as a laser having mirrors constructed from alternating layers of material having different indices of refraction. These lasers are better suited for the fabrication of arrays of lasers for displays, light sources, optical scanners, and optical fiber data links.

To increase the bandwidth of an optical communication network, multiple fibers are used to transmit information in parallel. Each fiber must be driven by a separate laser. One method for driving the multiple fibers is to couple an array of VCSELs to a fiber optic ribbon cable.

Electrically, each VCSEL is equivalent to a light emitting diode that is driven by a semiconductor driver. To provide the highest possible bandwidth to the fibers, the lasers must be driven as fast as possible. Accordingly, N-type driving circuits are needed. However, to obtain an N-type driving circuit, conventional VSCSEL designs require that the VCSEL be constructed on a p-doped compound-semiconductor substrate.

A VCSEL array is electrically equivalent to an array of photodiodes, which are connected to the underlying substrate. Since the substrate is a semiconductor, the diodes are connected in common. This leaves only the top layer of the diode for connection to the individual driving circuits. Hence, to use N-type driving circuits, the top of the diode must be n-doped. Accordingly, the bottom mirror layers are constructed from p-doped semiconductor layers.

Construction of a VCSEL on a p-doped substrate leads to a device that has inherently poorer performance than devices constructed on an n-doped substrate. This difference in performance is the result of the higher diffusivity of the p-type dopants. It is also more difficult to provide good current confinement in the top n-type mirror layer.

The VCSEL is constructed by depositing a series of layers of semi-conducting materials over the substrate. Each deposition step subjects the device to high temperatures. When the bottom mirror layers are constructed from p-type materials, the dopants from the layers already deposited to form the bottom mirror diffuse upwards into the n-type doped regions that are fabricated on top of the light emitting layer and which form the top mirror.

Accordingly, it is preferable to construct the device on an n-doped substrate, as the n-type dopants exhibit lower diffusion, and hence, do not contaminate the p-type layers fabricated on top of the light emitting layer. However, this is incompatible with the n-drive requirement.

Broadly, it is the object of the present invention to provide an improved VCSEL design.

It is a further object of the present invention to provide a VCSEL array in which the individual VCSELs may be driven by either p-drive or n-drive circuitry.

These and other objects of the present invention will become apparent to those skilled in the art from the following detailed description of the invention and the accompanying drawings.

SUMMARY OF THE INVENTION

The present invention is a VCSEL that is adapted to the fabrication of an array of VCSELs. A VCSEL array according to the present invention includes first and second VCSELs for generating light of a predetermined wavelength. Each VCSEL includes a bottom reflector comprising an epitaxial layer of a semiconductor of a first conductivity type, a light generation region and a top reflector comprising a semiconductor of a second conductivity type. A bottom electrode is electrically connected to the bottom reflector, and a top electrode is electrically connected to the top reflector. The bottom electrode is grown on a buffer layer having an electrical conductivity less than a predetermined value and a crystalline structure that permits epitaxial growth of the bottom reflector on the buffer layer. The bottom reflector of each of the VCSELs is in contact with the buffer layer. The first and second VCSELs are electrically isolated from one another by a trench extending into the buffer layer. The buffer layer is constructed from a material having resistivity that is sufficiently low to prevent crosstalk between the first and second VCSELs.

DETAILED DESCRIPTION OF THE INVENTION

Figure 1:
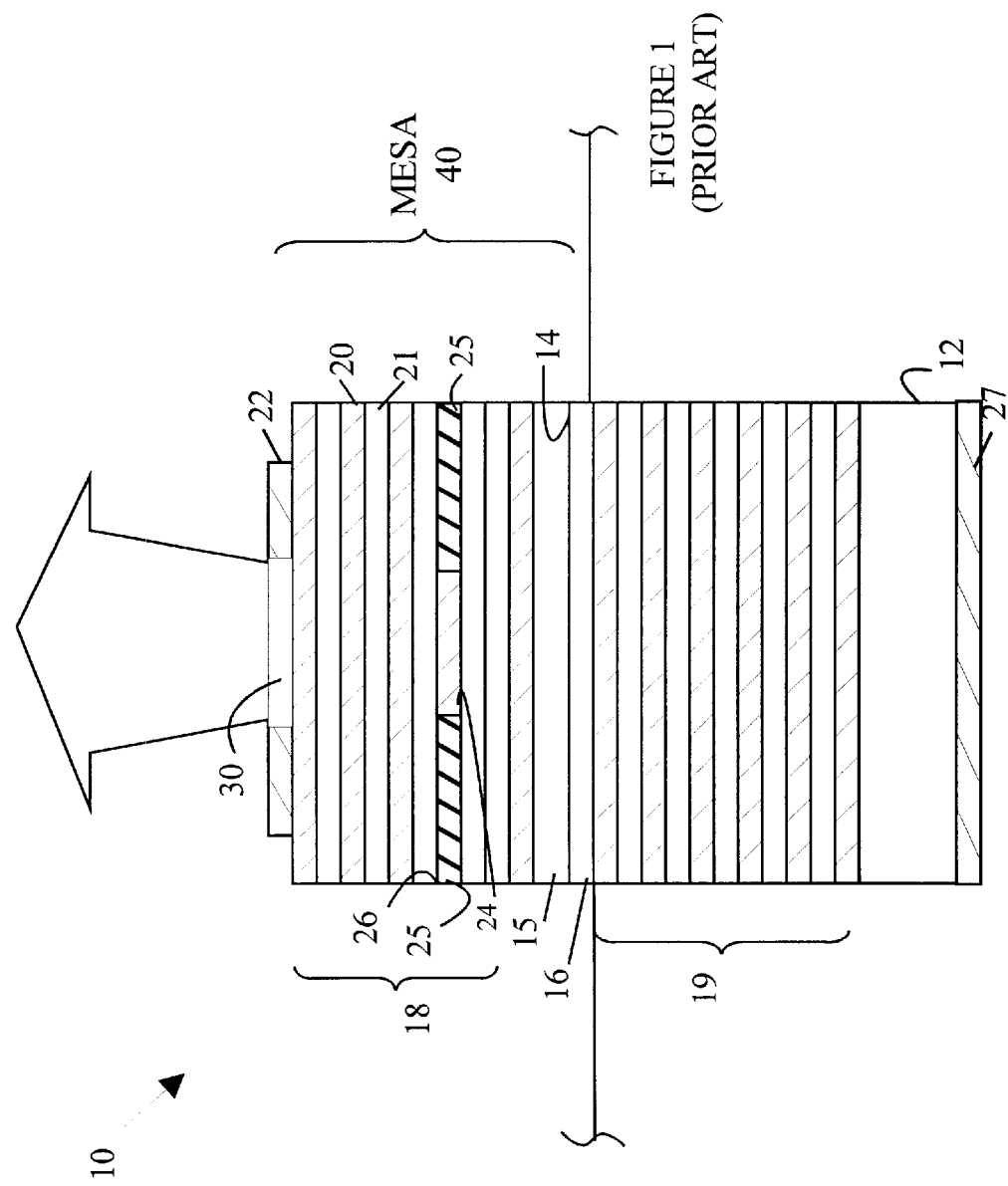
FIG. 1 is a cross-sectional view of a conventional native oxide top emitting VCSEL.

The present invention may be more easily understood with reference to FIG. 1 which is a cross-sectional view of a conventional native oxide top emitting VCSEL 10. Since construction of VCSELs is well known to those skilled in the laser arts, it will not be described in detail here. For the purposes of this discussion, it is sufficient to note that VCSEL 10 may be viewed as a p-i-n diode having a top mirror region 18, a light generation region 14, and bottom mirror region 19. These regions are constructed on a substrate 12. Electrical power is applied between electrodes 22 and 27. The various layers are constructed by epitaxial growth. As noted above, substrate 12 is preferably an n-type semiconductor.

The active region is typically constructed from one or more quantum wells of InGaAs, GaAs, AlGaAs, also (Al)GaInP or InAlGaAs which is separated from mirror regions 18 and 19 by spacers 15 and 16, respectively. The choice of material depends on the desired wavelength of the light emitted by the VCSEL. In addition, devices based on bulk active regions are known to the art. This layer 14 may be viewed as a light generation layer which generates light due to spontaneous and stimulated emission via the recombination of electrons and holes generated by forward biasing the p-i-n diode.

Current is confined to the portion of the light emitting layer that contributes to the output light beam by an insulating region 25. In the embodiment shown in FIG. 1, insulating region 25 is created by oxidizing one of the mirror layers. However, embodiments in which an implant is used for this function are also well known in the art.

The mirror regions are constructed from alternating layers of which layers 20 and 21 are typical. These layers have different indices of refraction. The thickness of each layer is chosen to be one quarter of the wavelength of the light. The stacks form Bragg mirrors. The stacks are typically constructed from alternating layers of AlAs and GaAs or AlGaAs. To obtain the desired reflectivity, 20 to 30 pairs of layers are typically required. The layers in the upper mirror region 18 are typically doped to be p-type semiconductors and those in the lower mirror region 19 are doped to be n-type semiconductors.

VCSEL 10 is typically driven by applying a voltage between electrodes 22 and 27. In an array of VCSELs, substrate 12 and electrode 27 are common to all of the VCSELs in the array. The individual VCSELs are electrically isolated from one another by creating a trench that extends below light generation layer 14, leaving the upper portion of each VCSEL as a mesa 40. As noted above, this common connection and the fact that the preferred substrate is n-type forces the designer to chose between device performance and drive circuit performance.

The present invention is based on the observation that there are substrates that will support the epitaxial growth of the various layers, but which are insulators or semi-insulators, i.e., non-electrically conducting. These substrates may be used as an isolation layer, which allows both terminals of the p-i-n diode to be isolated from the corresponding terminals of the other VCSELs in the array. In the preferred embodiment of the present invention, both of the terminals are accessible from the top of the die, allowing the device to be driven by either p-type or n-type driving circuitry. Hence, a VCSEL which is constructed by first depositing the n-type layers can be constructed and still be driven by n-type drive circuits.

Figure 2:
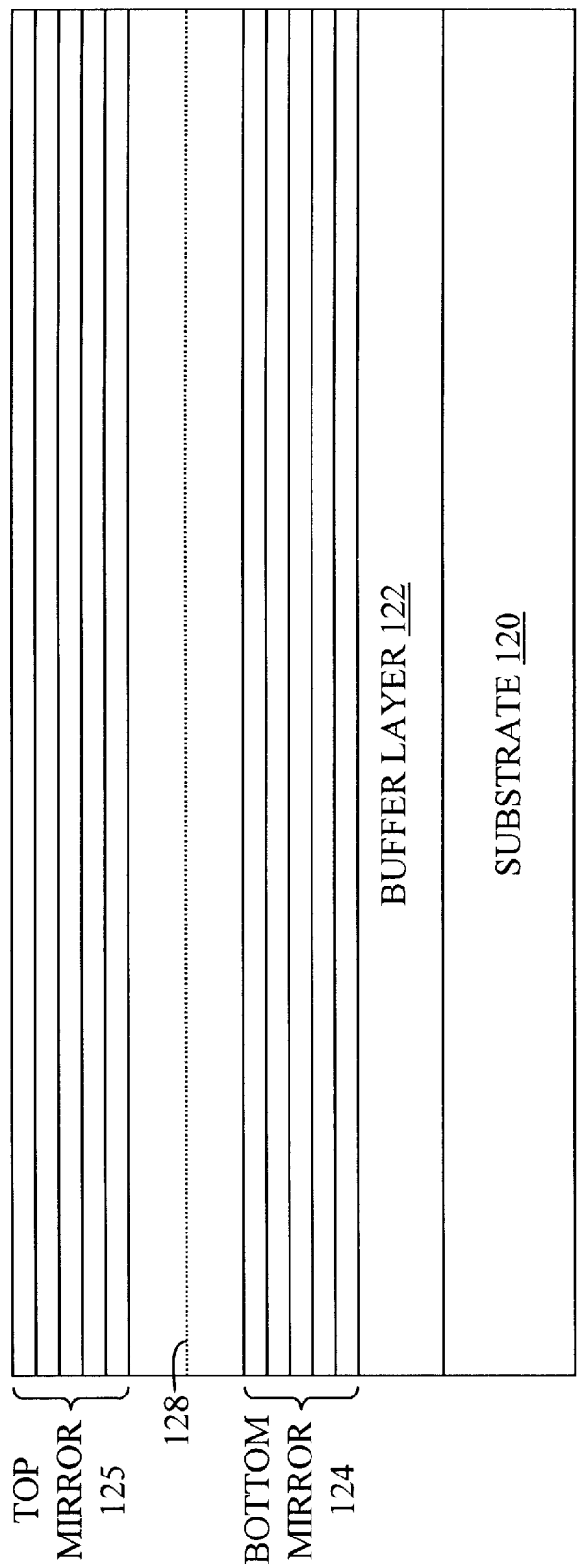
FIG. 2 is a cross-sectional view of the various layers that are deposited on a substrate to provide the mirrors and light emitting regions in the VCSELs in an array according to the present invention.

The manner in which an array of VCSELs according to the present invention is constructed will now be explained in more detail with reference to FIGS. 2 and 3. FIG. 2 is a cross-sectional view of the various layers that are deposited on a substrate 120 to provide the mirrors and light emitting regions of the VCSELs in the array. First, a buffer layer 122 is deposited on substrate 120. The buffer layer is grown epitaxially and can consist of any material that has sufficiently low conductivity to prevent cross-talk between adjacent VCSELs in the array. GaAs may be utilized as the buffer layer provided the GaAs has a doping level on the order of $10^{15}$ cm$^{-3}$ or less. Thickness of such a layer will depend on the active voltage bias across such a layer. For the bias values typically utilized in VCSELs, a buffer layer having a thickness of 1–2 $\mu$m is sufficient.

The buffer layer may also be formed by oxygen implantation of the substrate, or oxidation of the substrate. For example, an oxidation based buffer layer can be generated by oxidizing an AlGaAs layer to form a semi-insulating layer under the VCSEL device. The oxygen implant dose will be dependent on the doping level of the layer whose conductivity is to be reduced.

The layer substrate is then chemically etched to form the individual VCSELs. Refer now to FIG. 3, which is a cross-sectional view of two adjacent VCSELs, 160 and 161, in the array. The array shown in FIG. 3 emits light from the top surface and is intended to be mounted by bonding to a substrate via pads that connect to the p-terminal and n-terminal of the p-i-n diode. The mounting pads for VCSEL 160 are shown at 141 and 142. For the purposes of the present discussion, it will be assumed that pad 142 is connected to the n-terminal, i.e., Bragg reflector 124 is constructed from n-type semiconductor layers. However, it will be apparent to those skilled in the art that devices in which the bottom reflector is constructed from p-type layers may also be constructed without deviating from the teachings of the present invention. Since both the p-terminal and n-terminal are isolated from the substrate, switching may be accomplished by connecting either the p-terminal or the n-terminal to the appropriate driving circuitry.

The VCSELs are isolated from one another by trenches, as shown at 150–152. These trenches extend into buffer layer 122. The trenches may also extend into the underlying substrate; however, this is not required. It should also be noted that buffer layer 122 does not need to be a complete insulator. All that is required is that buffer 122 be sufficiently insulating to prevent a significant amount of current from flowing between adjacent VCSELs in the array. In practice, workable devices are obtained when no more than 10 percent of the current flowing between the p and n-terminals escapes through buffer layer 122.

As noted above, it is advantageous to restrict the current flowing across light generation region 128 to the region under the window in electrode 134 through which light exits the device. In the preferred embodiment of the present invention, this is accomplished by implanted regions 131 and 132, which convert a portion of the top mirror Bragg reflector 125 to an insulator. Hydrogen or oxygen implantation may be used for this purpose.

In the preferred embodiment of the present invention, a third implant region shown at 133 is also utilized. Implant 133 helps in preventing current from flowing across light generation region 128 under electrode 135. The actual connection to the Bragg reflector 124 is preferably in the trench region shown at 136.

Figure 3:
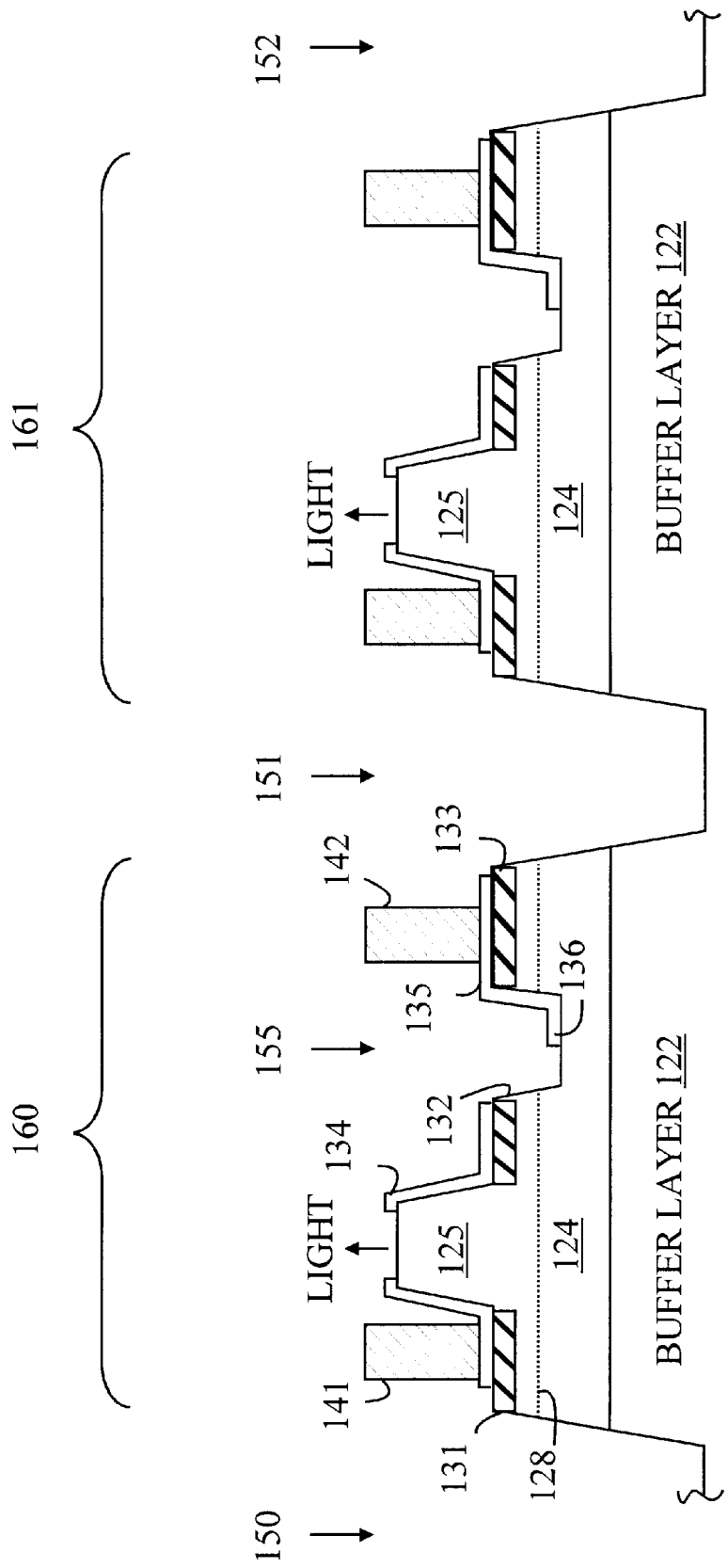
FIG. 3 is a cross-sectional view of two adjacent VCSELs in an array according to the present invention.

As noted above, the embodiment of the present invention shown in FIG. 3 is adapted to be mounted via solder pads 141 and 142 to an overlying substrate. Hence, the contacts 134 and 135 have been arranged to be at the same height to facilitate the mounting operation. In embodiments in which the connections to the n-terminal are not constrained to be at the same height as those to the p-terminal, a connection at the bottom of trench 155 is sufficient, and the structure above the trench floor may be omitted, i.e., the portion of Bragg reflector 125 and light generation layer 128 under conductor 135.

Bottom emitting VCSEL arrays according to the present invention may also be constructed. In this case, the buffer layer must be transparent at the emission wavelength so that the light can exit through the buffer layer. The number of layers in the bottom Bragg reflector must also be reduced to allow some of the light to escape the bottom reflector. In addition, the window in the electrode 134 shown in FIG. 3 needs to be filled with a reflective material or the number of layers in the top Bragg reflector needs to be increased sufficiently to assure that essentially all of the light is reflected back toward the buffer layer.

The above-described embodiments of the present invention utilized a separate buffer layer that was grown on top of a substrate. However, it will be apparent to those skilled in the art that the substrate can serve both functions if the substrate has sufficiently low conductivity. As noted above, undoped GaAs can be utilized as the buffer layer. In addition, the conductivity of doped GaAs can be reduced to acceptable levels by further doping. For example, chromium can be used as a dopant to reduce the conductivity of doped GaAs to acceptable layers. Accordingly, the VCSEL can be constructed directly on a GaAs substrate provided the conductivity of the substrate is sufficiently low.

Various modifications to the present invention will become apparent to those skilled in the art from the foregoing description and accompanying drawings. Accordingly, the present invention is to be limited solely by the scope of the following claims.

What is claimed is:

1. A VCSEL for generating light of predetermined wavelength, said VCSEL comprising:

a bottom reflector comprising an epitaxial layer of a semiconductor of a first conductivity type;

a light generation region;

a top reflector comprising a semiconductor of a second conductivity type;

a bottom electrode electrically connected to said bottom reflector;

a top electrode electrically connected to said top reflector; and a buffer layer having an electrical conductivity less than a predetermined value and a crystalline structure that permits epitaxial growth of said bottom reflector on said buffer layer, said bottom reflector being in contact with said buffer layer and said predetermined value being less than ten percent of the electrical conductivity of said semiconductor of said first conductivity type.

2. The VCSEL of claim 1 wherein said top and bottom electrodes comprise planar surfaces that are the same height above said buffer layer.

3. The VCSEL of claim 1 wherein said buffer layer is transparent to light of said predetermined wavelength.

4. An array of VCSELs comprising first and second VCSELs for generating light of a predetermined wavelength, each VCSEL comprising:

a bottom reflector comprising an epitaxial layer of a semiconductor of a first conductivity type;

a light generation region;

a top reflector comprising a semiconductor of a second conductivity type;

a bottom electrode electrically connected to said bottom reflector;

a top electrode electrically connected to said top reflector; and a buffer layer having an electrical conductivity less than a predetermined value and a crystalline structure that permits epitaxial growth of said bottom reflector on said buffer layer, wherein said bottom reflector of each of said VCSELs is in contact with said buffer layer, and wherein said first and second VCSELs are electrically isolated from one another by a trench extending into said buffer layer, said predetermined value being sufficiently low to prevent cross-talk between said first and second VCSEL.

5. The VCSEL array of claim 4 wherein said top and bottom electrodes comprise planar surfaces that are the same height above said buffer layer.

6. The VCSEL array of claim 4 wherein said buffer layer is transparent to the light of said predetermined wavelength.

* * * * *